(12) United States Patent
Vining

(10) Patent No.: US 12,255,484 B2
(45) Date of Patent: Mar. 18, 2025

(54) USB BATTERY CHARGING MODE ADVERTISING AND DIFFERENTIATION

(71) Applicant: TEXAS INSTRUMENTS INCORPORATED, Dallas, TX (US)

(72) Inventor: Suzanne Mary Vining, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 18/429,523

(22) Filed: Feb. 1, 2024

(65) Prior Publication Data
US 2024/0170989 A1 May 23, 2024

Related U.S. Application Data

(63) Continuation of application No. 17/485,001, filed on Sep. 24, 2021, now Pat. No. 11,936,229.

(60) Provisional application No. 63/083,119, filed on Sep. 25, 2020, provisional application No. 63/083,454, filed on Sep. 25, 2020.

(51) Int. Cl.
H01M 10/44 (2006.01)
G01R 19/10 (2006.01)
H01M 10/46 (2006.01)
H02J 7/00 (2006.01)

(52) U.S. Cl.
CPC .......... H02J 7/00712 (2020.01); G01R 19/10 (2013.01); H02J 7/0042 (2013.01); H02J 7/0047 (2013.01)

(58) Field of Classification Search
CPC .... H02J 7/0042; H02J 7/0047; H02J 7/00712; H02J 7/00036; H02J 2207/30; G01R 19/10

USPC ................. 320/107, 111, 114, 132, 152, 162
See application file for complete search history.

(56) References Cited

U.S. PATENT DOCUMENTS

| 11,218,007 | B1 | 1/2022 | Moubedi | |
|---|---|---|---|---|
| 11,936,229 | B2* | 3/2024 | Vining | G01R 19/10 |
| 2013/0154547 | A1 | 6/2013 | Wada | |
| 2019/0115634 | A1 | 4/2019 | Zhong | |

FOREIGN PATENT DOCUMENTS

CN 113489079 A 10/2021

OTHER PUBLICATIONS

Google translate CN113489079A (Year: 2021) 10 pages.

* cited by examiner

Primary Examiner — Edward Tso
(74) Attorney, Agent, or Firm — Ray A. King; Frank D. Cimino

(57) ABSTRACT

A method includes determining a charging port mode by receiving a data contact detect (DCD) Complete signal, reducing a voltage on a first data pin of a Universal Serial Bus (USB) connector of a portable device, and determining that a condition is true when a voltage on a second data pin of the USB connector is equal to or greater than 0.8 to 2.0 Volts (V), and is false otherwise. When the condition is true, a first signal is sent on a control circuit output indicating indicate that the PD is connected to a dedicated charging port (DCP) of Divider 0 mode. When the condition is false, a second signal is sent on the control circuit output indicating that the PD is connected to a DCP of 1.2V short mode.

13 Claims, 9 Drawing Sheets

USB BATTERY CHARGING MODE ADVERTISING AND DIFFERENTIATION

CROSS-REFERENCE TO RELATED APPLICATIONS

This application is a continuation of U.S. patent application Ser. No. 17/485,001, filed Sep. 24, 2021, which claims priority to U.S. Provisional Patent Application No. 63/083,119, which was filed Sep. 25, 2020, and to U.S. Provisional Patent Application No. 63/083,454, which was filed Sep. 25, 2020, all of which are hereby incorporated herein by reference in their entirety.

BACKGROUND

The Universal Serial Bus (USB) standards include specifications for serial communication, connecting power to portable devices, and battery charging. The USB specifications for battery charging provide for different types of charging ports, where each type provides a specified maximum charging current. A charging port indicates to a portable device the charging port's available charging current through voltage levels it provides on two of the pins of the USB connector. The portable device controls the amount of current it draws from the charger based on those voltage levels.

SUMMARY

In examples, a method includes determining a charging port mode, including by receiving a data contact detect (DCD) Complete signal. The method also includes, responsive to receiving the DCD Complete signal, reducing a first voltage on a first data pin of a Universal Serial Bus (USB) connector of a portable device (PD) to a second voltage, where the second voltage is lower than the first voltage. The method further includes determining that a condition is true based on a third voltage on a second data pin of the USB connector being equal to or greater than 0.8 to 2.0 Volts (V), and is false otherwise. The method still further includes, responsive to determining that the condition is true, sending a first signal on a control circuit output of a control circuit of the PD, where the first signal is configured to indicate that the PD is connected to a dedicated charging port (DCP) of Divider 0 mode. The method also includes, responsive to determining that the condition is false, sending a second signal on the control circuit output, where the second signal is configured to indicate that the PD is connected to a DCP of 1.2V short mode.

In another example, a device includes a connector having first and second connector pins and a switch coupled between the first connector pin and a resistor coupled to ground, the resistor having a resistance of 14.25 to 24.8 kiloohms. The device also includes a circuit that has a circuit input and a circuit output. The circuit input is coupled to the second connector pin and the circuit is configured to provide at the circuit output a true value based on a voltage on the second connector pin being equal to or greater than 0.8 to 2.0 Volts (V), and provide at the circuit output a false value otherwise. The device further includes a control circuit that has first and second control circuit inputs and first and second control circuit outputs. The first control circuit input is coupled to the circuit output. The first control circuit output is configured to actuate the switch. The control circuit is configured to make a charging port mode determination, including by receiving a data contact detect (DCD) Complete signal on the second control circuit input and, responsive to receiving the DCD Complete signal, closing the switch to couple the first connector pin to ground through the resistor. Making the charging port mode determination further includes determining a value of a condition, where the condition has a true value if the circuit output is a true value and a false value otherwise. Making the charging port mode determination still further includes opening the switch. Making the charging port mode determination also includes, responsive to determining that the condition is true, sending a first signal on the second control circuit output, where the first signal is configured to indicate that the device is coupled to a dedicated charging port (DCP) of Divider 0 mode. Making the charging port mode determination further includes, responsive to determining that the condition is false, sending a second signal on the second control circuit output, where the second signal is configured to indicate that the device is coupled to a DCP of Divider 1.2V short mode.

In another example, a system includes a connector having first and second connector pins and a switch coupled between the first connector pin and a resistor coupled to ground, the resistor having a resistance of 14.25 to 24.8 kiloohms. The system also includes a circuit that has a circuit input and a circuit output. The circuit input is coupled to the second connector pin and the circuit is configured to provide at the circuit output a true value based on a voltage on the second connector pin being equal to or greater than 0.8 to 2.0 Volts (V), and provide at the circuit output a false value otherwise. The system further includes a control circuit that has first and second control circuit inputs and first and second control circuit outputs. The first control circuit input is coupled to the circuit output. The first control circuit output is configured to actuate the switch. The control circuit is configured to make a charging port mode determination, including by receiving a data contact detect (DCD) Complete signal on the second control circuit input and, responsive to receiving the DCD Complete signal, closing the switch to couple the first connector pin to ground through the resistor. Making the charging port mode determination further includes determining a value of a condition, where the condition has a true value if the circuit output is a true value and a false value otherwise. Making the charging port mode determination still further includes opening the switch. Making the charging port mode determination also includes, responsive to determining that the condition is true, sending a first signal on the second control circuit output, where the first signal is configured to indicate that the system is coupled to a dedicated charging port (DCP) of Divider 0 mode. Making the charging port mode determination further includes, responsive to determining that the condition is false, sending a second signal on the second control circuit output, where the second signal is configured to indicate that the system is coupled to a DCP of Divider 1.2V short mode.

In another example, a method includes providing a voltage of 2.7 Volts (V) on each of a D+ data pin and a D− data pin of a Universal Serial Bus (USB) connector and waiting for a voltage on the D− data pin to drop below 2.32V, for a period longer than 500 microseconds (µs). The method also includes removing the voltage of 2.7V from each of the D+ and D− data pins and sinking a current of 25-175 microamps (µA) from the D− data pin to ground for a period of at least 20 µs. The method further includes determining a condition, where the condition has a true value if a voltage on the D+ data pin is greater than 0.25-0.4V and less than 0.8-2.0V, and has a false value otherwise. The method still further includes, responsive to determining that the condition is false, waiting for the D+ data pin to have a voltage less than VLGC and providing the voltage of 2.7V on each of the D+ and D− data pins.

In another example, a device includes a USB connector having a D+ data pin and a D− data pin and a first switch coupled between the D+ data pin and a resistor that is coupled to a voltage source of 2.7 Volts (V), where the resistor has a resistance of 30 kiloohms (kΩ). The device also includes a second switch coupled between the D− data pin and a resistor coupled to the voltage source of 2.7V, the resistor having a resistance of 30 kΩ. The device further includes a third switch coupled between the D+ data pin and a current sink configured to sink a current of 25-175 microamps (µA). The device still further includes a first circuit having a first circuit input and a first circuit output. The first circuit input is coupled to the D+ data pin and the first circuit is configured to provide at the first circuit output a true value based on a voltage on the D+ data pin being equal to or greater than 0.25-0.4V, and provide at the first circuit output a false value otherwise. The device also includes a second circuit having a second circuit input and a second circuit output. The second circuit input is coupled to the D+ data pin and the second circuit is configured to provide at the second circuit output a true value based on a voltage on the D+ data pin being equal to or greater than 0.8-2.0V, and provide at the second circuit output a false value otherwise. The device further includes a third circuit having a third circuit input and a third circuit output. The third circuit input is coupled to the D− data pin and the third circuit is configured to provide at the third circuit output a true value based on a voltage on the D− data pin being equal to or greater than 2.25-2.39V, and provide at the third circuit output a false value otherwise. The device still further includes a control circuit that has first, second and third control circuit inputs and first, second and third control circuit outputs. The first control circuit input is coupled to the first circuit output, the second control circuit input is coupled to the second circuit output, and the third control circuit input is coupled to the third circuit output. The first control circuit output is configured to actuate the first switch, the second control circuit output is configured to actuate the second switch, and the third control circuit output is configured to actuate the third switch. The control circuit configured to close the first switch and the second switch and determine a first condition, where the first condition has a true value if the third circuit output is false for a period longer than 500 microseconds (µs), and a false value otherwise. The control circuit is also configured to open the first switch and the second switch and close the third switch for a period of at least 20 µs, responsive to determining that the first condition is true. The control circuit is further configured to determine a second condition, where the second condition has a true value if the first circuit output is true and the second circuit output is false, and the second condition has a false value otherwise. The control circuit is still further configured to wait for a third condition to be false, where the third condition has a true value if the second circuit output is true, and a false value otherwise, responsive to the second condition being false. The control circuit is also configured to close the first switch and the second switch, responsive to the third condition being false.

In another example, a system includes a USB connector having a D+ data pin and a D− data pin and a first switch coupled between the D+ data pin and a resistor that is coupled to a voltage source of 2.7 Volts (V), where the resistor has a resistance of 30 kiloohms (kΩ). The system also includes a second switch coupled between the D− data pin and a resistor coupled to the voltage source of 2.7V, the resistor having a resistance of 30 kΩ. The system further includes a third switch coupled between the D+ data pin and a current sink configured to sink a current of 25-175 microamps (µA). The system still further includes a first circuit having a first circuit input and a first circuit output. The first circuit input is coupled to the D+ data pin and the first circuit is configured to provide at the first circuit output a true value based on a voltage on the D+ data pin being equal to or greater than 0.25-0.4V, and provide at the first circuit output a false value otherwise. The system also includes a second circuit having a second circuit input and a second circuit output. The second circuit input is coupled to the D+ data pin and the second circuit is configured to provide at the second circuit output a true value based on a voltage on the D+ data pin being equal to or greater than 0.8-2.0V, and provide at the second circuit output a false value otherwise. The system further includes a third circuit having a third circuit input and a third circuit output. The third circuit input is coupled to the D− data pin and the third circuit is configured to provide at the third circuit output a true value based on a voltage on the D− data pin being equal to or greater than 2.25-2.39V, and provide at the third circuit output a false value otherwise. The system still further includes a control circuit that has first, second and third control circuit inputs and first, second and third control circuit outputs. The first control circuit input is coupled to the first circuit output, the second control circuit input is coupled to the second circuit output, and the third control circuit input is coupled to the third circuit output. The first control circuit output is configured to actuate the first switch, the second control circuit output is configured to actuate the second switch, and the third control circuit output is configured to actuate the third switch. The control circuit configured to close the first switch and the second switch and determine a first condition, where the first condition has a true value if the third circuit output is false for a period longer than 500 microseconds (µs), and a false value otherwise. The control circuit is also configured to open the first switch and the second switch and close the third switch for a period of at least 20 µs, responsive to determining that the first condition is true. The control circuit is further configured to determine a second condition, where the second condition has a true value if the first circuit output is true and the second circuit output is false, and the second condition has a false value otherwise. The control circuit is still further configured to wait for a third condition to be false, where the third condition has a true value if the second circuit output is true, and a false value otherwise, responsive to the second condition being false. The control circuit is also configured to close the first switch and the second switch, responsive to the third condition being false.

DETAILED DESCRIPTION

Figure 1:
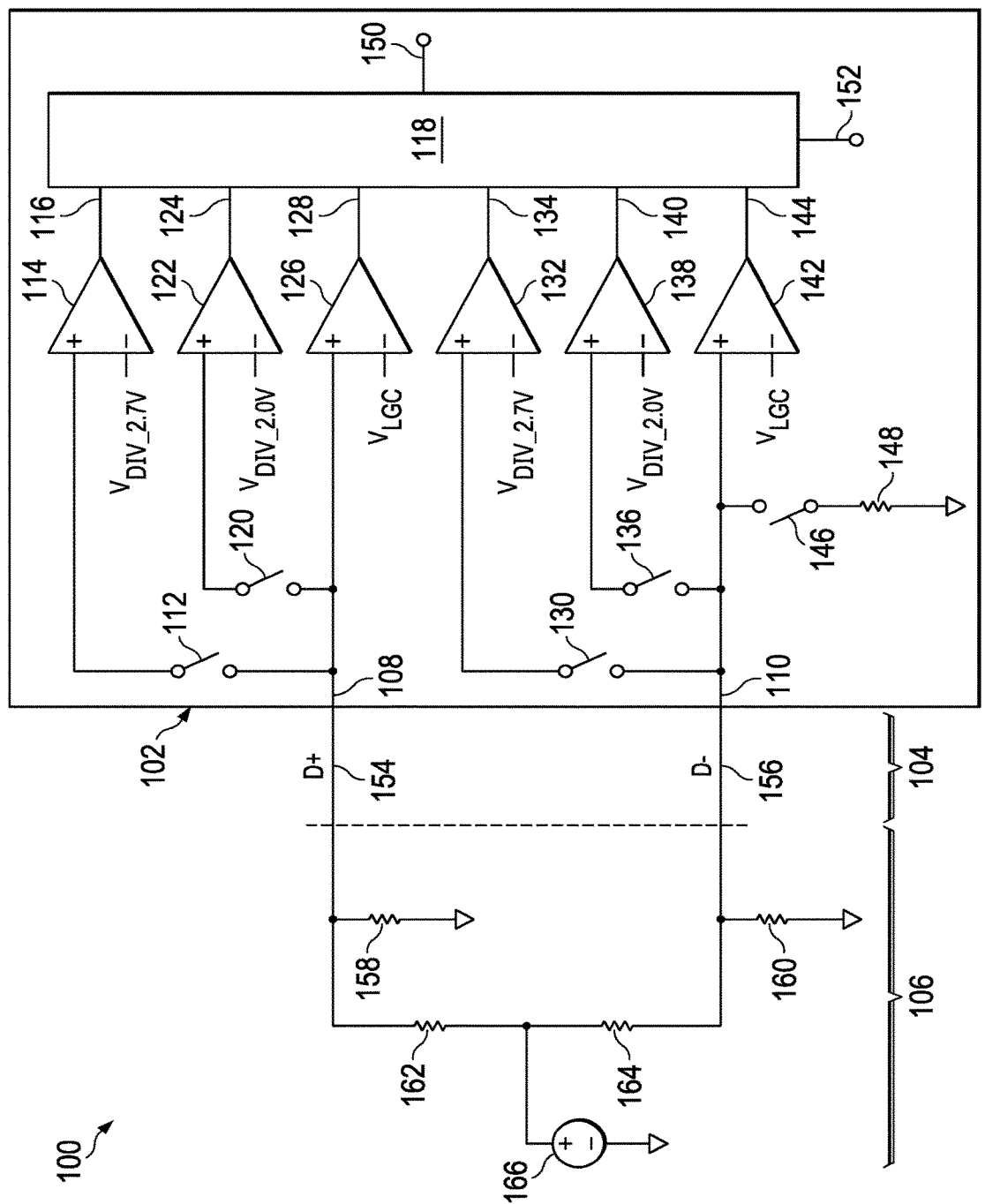
FIG. 1 is a schematic diagram of a first Universal Serial Bus (USB) portable device (PD) in accordance with various examples coupled by a cable to a Dedicated Charging Port (DCP) of Divider 0 mode.

Coupling of a PD to a USB charging port is defined by the USB Battery Charging Specification 1.2 published by the USB Implementers Forum, Inc. Coupling may include several phases. In a first phase (VBUS Detect), the PD determines whether a supply voltage is applied across the power pins (VBUS and GND (ground)) of its USB connector by comparing the voltage on its VBUS pin to a threshold value. In a second phase (Data Contact Detect (DCD)), the PD determines that the data pins of its USB connector (D+ and D−) are coupled to the USB charging port. In some PDs, DCD is an active process that includes sensing voltages on one or both of the data pins D+ and/or D−. In other PDs, DCD is a passive process that awaits a timeout signaling that a predetermined period of time has passed after the completion of VBUS Detect.

In an optional third phase (Primary Detection), the PD determines whether it is coupled to a Standard Downstream Port (SDP) or to one of a DCP or a Charging Downstream Port (CDP). If the PD determines that it is not coupled to an SDP, in an optional fourth phase (Secondary Detection) the PD determines whether it is coupled to a DCP or to a CDP.

The PD sets its charging current based on a charging mode of a charging port to which it is coupled (SDP, DCP, or CDP). DCPs of different charging modes are capable of providing different maximum currents to the PD. The charging mode of a DCP is indicated (or advertised) to the PD via the D+ and D− data pins of the USB connector:

A DCP of Divider 4 mode provides a maximum charging current of approximately 3 Amps (A) and advertises by providing a voltage of approximately 2.7 Volts (V) on the D+ pin and approximately 3.3V on the D− pin.

A DCP of Divider 3 mode provides a maximum charging current of approximately 2.4 A and advertises by providing a voltage of approximately 2.7V on both the D+ pin and the D− pin.

A DCP of Divider 2 mode provides a maximum charging current of approximately 2.1 A and advertises by providing a voltage of approximately 2.7V on the D+ pin and a voltage of approximately 2.0V on the D− pin.

A DCP of Divider 1 mode provides a maximum charging current of approximately 1 A and advertises by providing a voltage of approximately 2.0V on the D+ pin and a voltage of approximately 2.7V on the D− pin.

A DCP of Divider 0 mode provides a maximum charging current of approximately 500 milliamps (mA) and advertises by providing a voltage of approximately 2.0V on both the D+ and D− pins.

A DCP of 1.2V short mode provides a maximum charging current of approximately 2.0 A and advertises by coupling the D+ pin to the D− pin through a resistor and providing a voltage of approximately 1.2V on both the D+ and D− pins.

A DCP of Shorted mode (also referred to as a standard BC 1.2 DCP) provides a maximum charging current of approximately 1.5 A and advertises by coupling the D+ pin to the D− pin through a resistor without providing any voltage on either the D+ pin or the D− pin.

The voltages observed by the PD on its USB data pins may vary from the values described above because of variations in fabrication process, supply voltage, and/or ambient temperature (PVT). As a result of PVT variations, a PD that is coupled to a DCP of Divider 0 mode may observe a voltage of less than 2.0V on the USB data pins, bringing the voltage observed by the PD closer to the voltage observed on the USB data pins that is coupled to a DCP of 1.2V short mode.

In some examples, a PD may employ an analog-to-digital convertor (ADC) to determine whether the PD is coupled to a DCP of Divider 0 mode or 1.2V short mode. To provide an accurate determination despite the presence of PVT variations, such an ADC may call for high resolution. Such a high resolution ADC may use a large area in an integrated circuit or have a large footprint on a printed circuit board and may be power inefficient. In examples according to the description, the termination and resulting voltage on one of the USB data pins may be changed by the PD allowing use of voltage comparators, rather than an ADC, to determine a mode of the DCP to which the PD is coupled.

After completing DCD, the PD may sense the voltages provided on the D+ and D− data pins to attempt to identify DCPs of Divider 0, 1, 2, 3 and 4 modes (which may be referred to as the divider modes). If the PD cannot identify the charging port as one of the divider modes or cannot charge from a divider mode charging port, the PD may then enter Primary Detection to identify whether the PD is coupled to an SDP, DCP or CDP and, if coupled to a DCP, whether to a Shorted mode DCP providing a lower charging current or to a 1.2V short mode DCP providing a higher charging current.

In both active DCD and Primary Detection, the PD takes an action that causes the voltage on the D− data pin to drop from the voltage provided on the pin by the charging port to advertise its charging mode. In some examples, a charging port may advertise as one of Divider 2, 3 or 4 modes, but in response to sensing a voltage drop on the D− data pin (whether resulting from DCD or Primary Detection) the charging port may treat the voltage drop as though the PD is entering Primary Detection and change from advertising as a Divider 2, 3 or 4 mode to advertising as a Shorted mode or 1.2V short mode DCP.

In examples according to the description, a charging port advertising as a Divider 3 or 4 mode determines whether the voltage drop on the D− data pin signals the PD entering DCD or Primary Detection. If the charging port determines that the PD is entering DCD, the charging port returns to advertising as a Divider 3 or 4 mode charging port after DCD is complete. However, if the charging port determines that the voltage drop on the D− data pin signals the PD entering Primary Detection, the charging port begins advertising as a Shorted mode or 1.2V short mode DCP.

FIG. 1 is a schematic diagram 100 of a first Universal Serial Bus (USB) portable device (PD) 102 in accordance with various examples coupled by a cable 104 to a DCP 106 of Divider 0 mode. In accordance with various examples, the PD 102 may be any system or other device having a battery and configured to charge the battery from a USB charging port. Examples of such systems include a cell phone, tablet computer, laptop computer, and earphones. The PD 102 includes a D+ pin 108 and a D− pin 110. The D+ pin 108 and the D− pin 110 are coupled to one or more other components of the PD 102 that are not shown in FIG. 1.

The D+ pin 108 is coupled by a switch 112 to a non-inverting input of a voltage comparator (or simply comparator) 114. An inverting input of the comparator 114 is coupled to a VDIV_2.7V voltage source, where VDIV_2.7V is nominally 2.32V, or other voltage in the range 2.25-2.39V. An output 116 of the comparator 114 is coupled to a control circuit 118. The switch 112 and the comparator 114 form a circuit configured to provide a true value based on the D+ pin 108 being at or above VDIV_2.7V and a false value otherwise.

The D+ pin 108 is also coupled by a switch 120 to a non-inverting input of a comparator 122. An inverting input of the comparator 122 is coupled to a VDIV_2.0V voltage source, where VDIV_2.0V is nominally 1.7V, or other voltage in the range 1.67-1.78V. An output 124 of the comparator 122 is coupled to the control circuit 118. The switch 120 and the comparator 122 form a circuit configured to provide a true value based on the D+ pin 108 being at or above VDIV_2.0V and a false value otherwise.

The D+ pin 108 is further coupled to a non-inverting input of a comparator 126. An inverting input of the comparator 122 is coupled to a VLGC voltage source, where VLGC is nominally 1.4V, or other voltage in the range 0.8-2.0V. An output 128 of the comparator 126 is coupled to the control circuit 118. The comparator 126 forms a circuit configured to provide a true value based on the D+ pin 108 being at or above VLGC and a false value otherwise.

The D− pin 110 is coupled by a switch 130 to a non-inverting input of a comparator 132. An inverting input of the comparator 132 is coupled to the VDIV_2.7V voltage source. An output 134 of the comparator 132 is coupled to the control circuit 118. The switch 130 and the comparator 132 form a circuit configured to provide a true value based on the D− pin 110 being at or above VDIV_2.7V and a false value otherwise.

The D− pin 110 is also coupled by a switch 136 to a non-inverting input of a comparator 138. An inverting input of the comparator 138 is coupled to the VDIV_2.0V voltage source. An output 140 of the comparator 138 is coupled to the control circuit 118. The switch 136 and the comparator 138 form a circuit configured to provide a true value based on the D− pin 110 being at or above VDIV_2.0V and a false value otherwise.

In other examples, switches 112, 120, 130 and 136 may be omitted and the comparators 114 and 122 coupled directly to the D+ pin 108 and the comparators 132 and 138 coupled directly to the D− pin 110.

The D− pin 110 is further coupled to a non-inverting input of a comparator 142. An inverting input of the comparator 142 is coupled to the VLGC voltage source. An output 144 of the comparator 142 is coupled to the control circuit 118. The comparator 142 forms a circuit configured to provide a true value based on the D− pin 110 being at or above VLGC and a false value otherwise.

The D− pin 110 is still further coupled by a switch 146 in a pull-down configuration through an RDM_DWN pull down resistor 148 to ground, where RDM_DWN is a resistance in the range 14.25-24.8 kiloohms (kΩ). In other examples, the D+ pin 108 may be coupled by a switch to an RDM_DWN pull down resistor.

As will be described with reference to FIG. 3, the control circuit 118 includes outputs configured to actuate (e.g., open or close) the switches 112, 120, 130, 136, and 146 via control connections not shown in FIGS. 1 and 2. The control circuit 118 makes a charging port mode determination and provides a signal on an output 150 indicating a mode of the charging port to which the PD 102 is connected. The control circuit 118 receives from other circuitry of the PD 102 a DCD Complete signal on an input 152, the DCD Complete signal indicating that the PD 102 has completed DCD and allowed any voltages applied to the D+ pin 108 and D− pin 110 during DCD to discharge.

The D+ pin 108 and D− pin 110 are coupled to D+ and D− conductors 154 and 156, respectively, of the cable 104. In the DCP 106 the D+ conductor 154 and the D− conductor 156 are coupled to ground respectively via pull down resistors 158 and 160. The D+ conductor 154 and the D− conductor 156 are also coupled respectively via resistors 162 and 164 to a VBUS voltage source 166, where VBUS has a nominal value of 5.0V.

Figure 2:
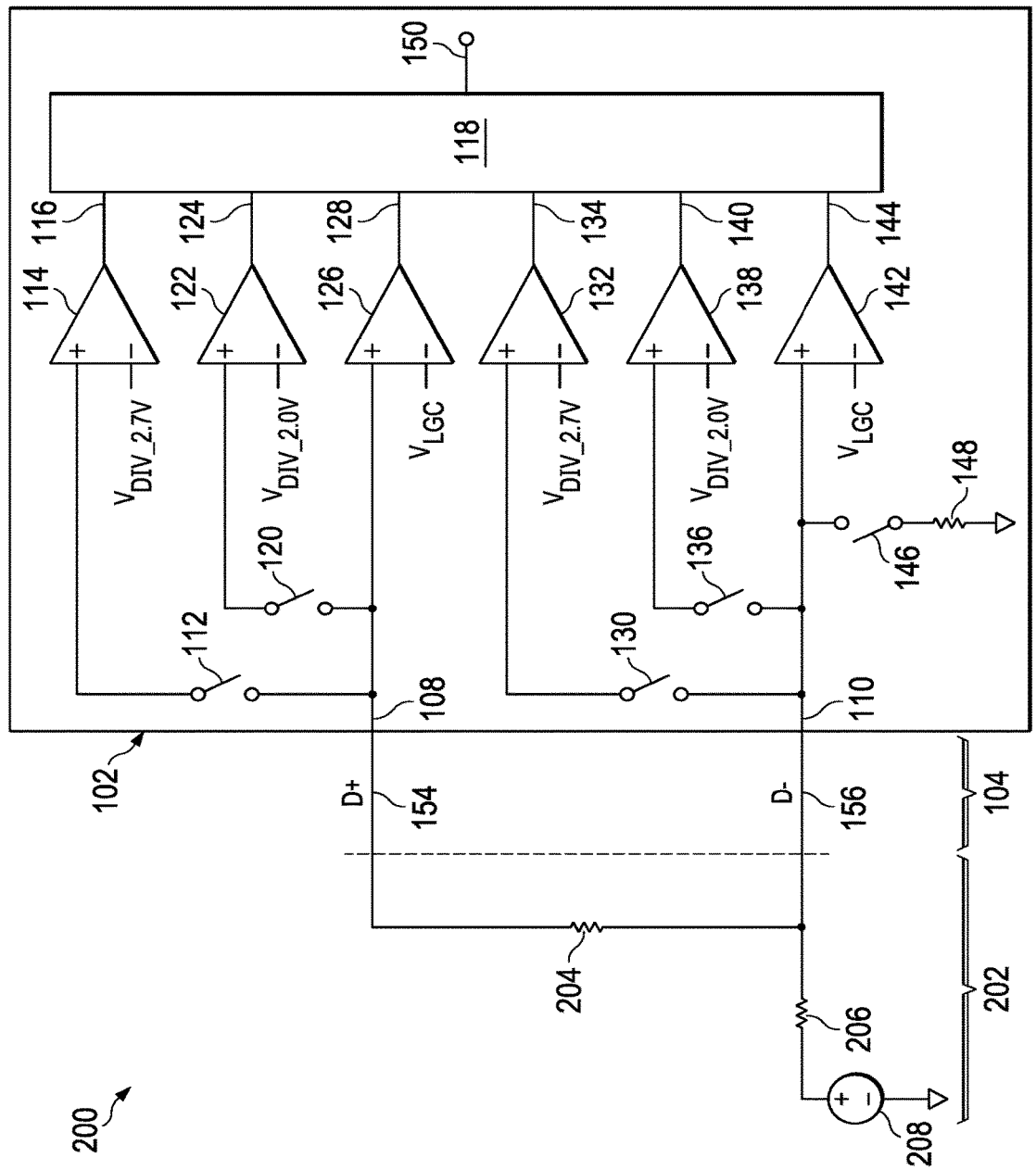
FIG. 2 is a schematic diagram of the first PD in accordance with various examples coupled by a cable to a DCP of 1.2V short mode.

FIG. 2 is a schematic diagram 200 of the first PD 102 coupled by the cable 104 to a DCP 202 of 1.2V short mode. The components of the PD 102 and the conductors of the cable 104 are the same as those shown in FIG. 1. As described with reference to FIG. 1, the D+ pin 108 and the D− pin 110 are coupled to one or more other components of the PD 102 that are not shown in FIG. 2.

In the DCP 202 the D+ conductor 154 is coupled to the D− conductor 156 via a resistor 204 having a resistance less than 200 Ohms (Q). The D− conductor 156 is coupled via a resistor 206 having a nominal resistance of 200Ω, or otherwise in the range 150-200Ω, to voltage source 208 providing a voltage of approximately 1.28V.

In the examples shown in FIGS. 1 and 2, the PD 102 is coupled via the cable 104 to the DCP 106 of Divider 0 mode and the DCP 202 of 1.2V short mode, respectively. In other examples, the PD 102 may couple directly to the DCP 106 or the DCP 202. In the examples shown in FIGS. 1 and 2, respectively, the PD 102 is coupled to DCPs that are of Divider 0 mode and 1.2V short mode. In other examples, PDs according to the examples may be coupled to charging ports of other charging modes.

Because the D+ conductor 154 is coupled to the D− conductor 156 via the resistor 204 in the DCP 202, closing the switch 146 to couple the pull down resistor 148 to the D− pin 110 affects the voltage on both the D− pin 110 and the D+ pin 108. In contrast, because the D+ conductor 154 and the D− conductor 156 are not coupled to each other in the DCP 106, closing the switch 146 to couple the pull down resistor 148 to the D− pin 110 affects the voltage on the D− pin 110 but not the voltage on the D+ pin 108. These voltages are sensed using the comparators 126 and 142, rather than by using an ADC.

Figure 3:
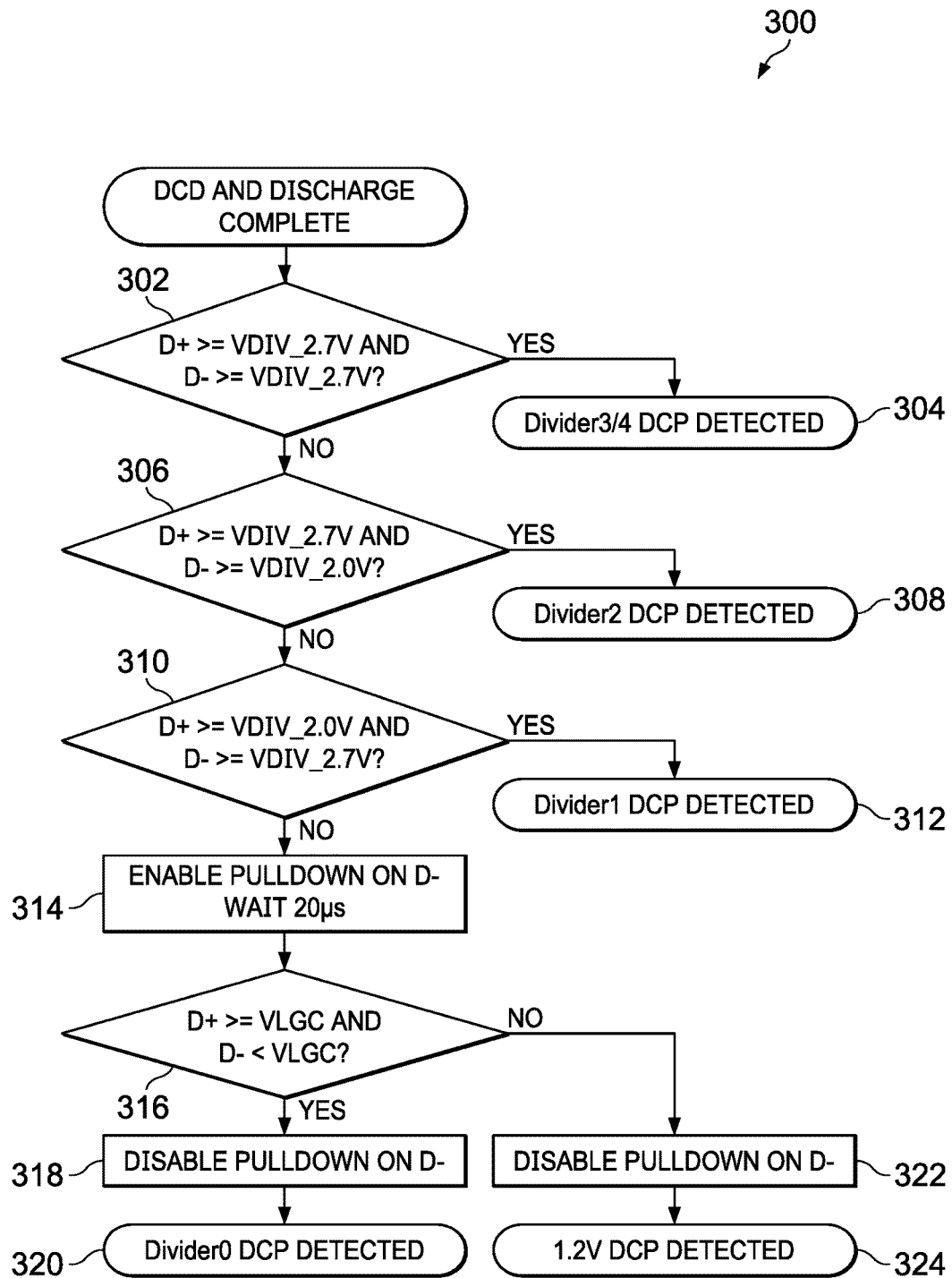
FIG. 3 is a flow diagram of a first method for making a charging port mode determination in the first PD in accordance with various examples.

FIG. 3 is a flow diagram of a first method 300 for making a charging port mode determination in the first PD 102 in accordance with various examples. The method 300 is described with reference to the components of the PD 102 shown in FIGS. 1 and 2. The method 300 begins in response to the control circuit 118 receiving the signal on the input 152 indicating that the PD 102 has completed DCD and allowed any voltages applied to the D+ pin 108 and D− pin 110 during DCD to discharge.

In step 302 the control circuit 118 closes switches 112 and 130 coupling the comparators 114 and 132 to the D+ and D− pins 108 and 110, respectively. The control circuit 118 then senses comparator outputs 116 and 134 to determine whether both D+ pin 108 and D− pin 110 are at or above VDIV_2.7V. If so, in step 304 the control circuit 118 provides a signal on the output 150 indicating that the PD 102 is connected to a DCP of either Divider 3 mode or Divider 4 mode and the method 300 ends.

If it is determined in step 302 that one or both of the D+ pin 108 and the D− pin 110 is below VDIV_2.7V, then in step 306 the control circuit 118 opens the switch 130 and closes the switch 136, leaving the comparator 114 coupled to the D+ pin 108, uncoupling the comparator 132 from the D− pin 110, and coupling the comparator 138 to the D− pin 110. The control circuit 118 then senses comparator outputs 116 and 140 to determine whether the D+ pin 108 is at or above VDIV_2.7V and the D− pin 110 is at or above VDIV_2.0V. If so, in step 308 the control circuit 118 provides a signal on the output 150 indicating that the PD 102 is connected to a DCP of Divider 2 mode and the method 300 ends.

If it is determined in step 306 that the D+ pin 108 is not at or above VDIV_2.7V or the D− pin 110 is not at or above VDIV_2.0V, then in step 310 the control circuit 118 opens the switches 112 and 136, uncoupling the comparators 114 and 138 from the D+ pin 108 and the D− pin 110, respectively. The control circuit 118 also closes the switches 120 and 130, coupling the comparators 122 and 132 to the D+ pin 108 and the D− pin 110, respectively. The control circuit 118 then senses comparator outputs 124 and 134 to determine whether the D+ pin 108 is at or above VDIV_2.0V and the D− pin 110 is at or above VDIV_2.7V. If so, in step 312 the control circuit 118 provides a signal on the output 150 indicating that the PD 102 is connected to a DCP of Divider 1 mode and the method 300 ends.

If it is determined in step 310 that the D+ pin 108 is not at or above VDIV_2.0V or the D− pin 110 is not at or above VDIV_2.7V, then in step 314 the control circuit 118 opens the switches 120 and 130, uncoupling the comparators 122 and 132 from the D+ pin 108 and the D− pin 110, respectively, and leaving the D+ pin 108 and the D− pin 110 coupled to the comparators 126 and 142, respectively. The control circuit 118 then closes the switch 146 to couple the D− pin 110 to the pull down resistor 148. After a delay of at least 20 microseconds (μs), in step 316 the control circuit 118 senses comparator outputs 128 and 144 to determine whether the D+ pin 108 is at or above VLGC and the D− pin 110 is below VLGC. If so, in step 318 the control circuit 118 opens the switch 146 to uncouple the D− pin 110 from the pull down resistor 148 and, in step 320, provides a signal on the output 150 indicating that the PD 102 is connected to a DCP of Divider 0 mode (e.g., DCP 106) and the method 300 ends.

If it is determined in step 316 that the D+ pin 108 is not at or above VLGC or the D− pin 110 is at or above VLGC, then in step 322 the control circuit 118 opens the switch 146 to uncouple the D− pin 110 from the pull down resistor 148 and, in step 324, provides a signal on the output 150 indicating that the PD 102 is connected to a DCP of 1.2V short mode (e.g., DCP 202) and the method 300 ends.

Figure 4:
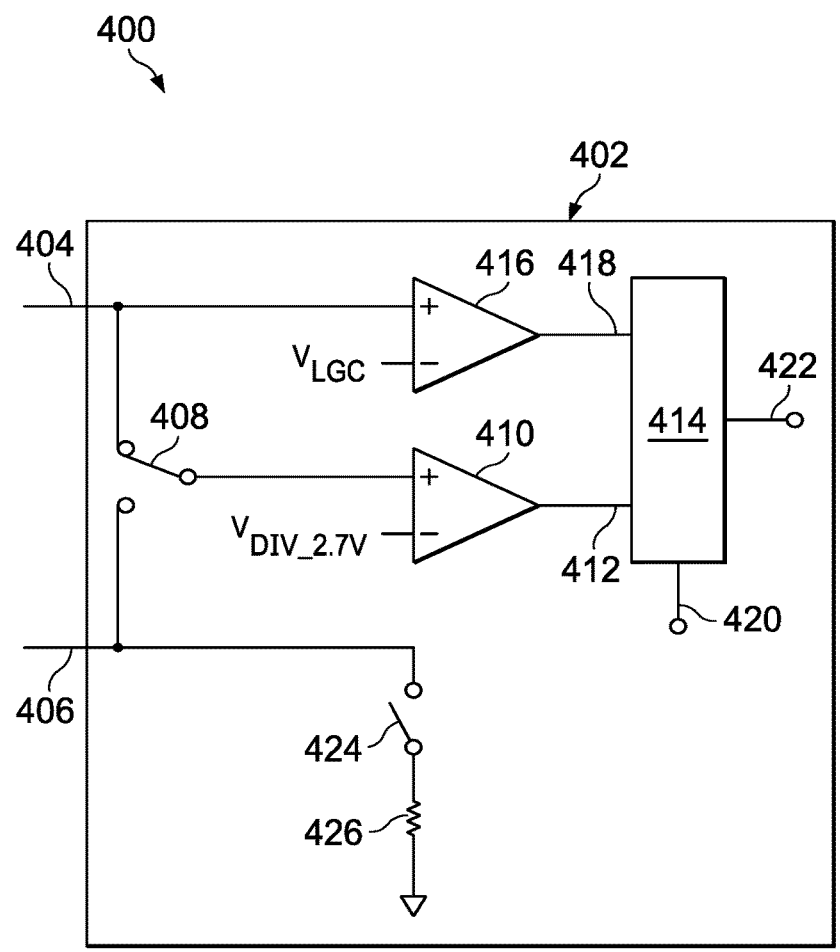
FIG. 4 is a schematic diagram of a second PD in accordance with various examples.

FIG. 4 is a schematic diagram 400 of a second PD 402 in accordance with various examples. In accordance with various examples, the PD 102 may be any system or other device having a battery and configured to charge the battery from a USB charging port. Examples of such systems include a cell phone, tablet computer, laptop computer, and earphones. As described for the PD 102 in FIGS. 1 and 2, the PD 402 may be coupled directly or via a cable (e.g., cable 104) to a DCP (e.g., DCP 106) of Divider 0 mode, to a DCP (e.g., DCP 202) of 1.2V short mode, or to a charging port of another charging mode. The PD 402 includes a D+ pin 404 and a D− pin 406. The D+ pin 404 and the D− pin 406 may also be coupled to one or more other components of the PD 402 that are not shown in FIG. 4.

The D+ pin 404 is coupled to a first switched terminal of a single pole double throw switch 408. The D− pin 406 is coupled to a second switched terminal of the switch 408. A common terminal of the switch 408 is coupled to a non-inverting input of a comparator 410. An inverting input of the comparator 410 is coupled to a VDIV_2.7V voltage source. An output 412 of the comparator 410 is coupled to a control circuit 414. The switch 408 and the comparator 410 form a circuit configured to provide a true value based on either the D+ pin 404 or the D− pin 406 (depending on the position of the switch 408) being at or above VDIV_2.7V and a false value otherwise.

The D+ pin 404 is also coupled to a non-inverting input of a comparator 416. An inverting input of the comparator 416 is coupled to a VLGC voltage source. An output 418 of the comparator 416 is coupled to the control circuit 414. The comparator 416 forms a circuit configured to provide a true value based on the D+ pin 404 being at or above VLGC and a false value otherwise.

The control circuit 414 makes a charging port mode determination and provides a signal on an output 422 indicating a mode of charging port to which the PD 402 is connected. The control circuit 414 receives from other circuitry of the PD 402 a DCD Complete signal on an input 420, the DCD Complete signal indicating that the PD 402 has completed DCD and allowed any voltages applied to the D+ pin 404 and the D− pin 406 during DCD to discharge.

The D− pin 406 is coupled by a switch 424 in a pull-down configuration through an RDM_DWN pull down resistor 426 to ground. In other examples, the D+ pin 404 may be coupled by a switch to an RDM_DWN pull down resistor and the comparator 416 coupled to the D− pin 406. As will be described with reference to FIG. 5, the control circuit 414 includes outputs configured to actuate (i.e., open or close) the switches 408 and 424 via control connections not shown in FIG. 4.

As described with reference to the PD 102, because the D+ pin 404 is coupled to the D− pin 406 via a resistor in a DCP of 1.2V short mode (e.g., DCP 202), closing the switch 424 to couple the pull down resistor 426 to the D− pin 406 affects the voltage on both the D− pin 406 and the D+ pin 404. In contrast, closing the switch 424 to couple the pull down resistor 426 to the D− pin 406 while coupled to a DCP of Divider 0 mode (e.g., DCP 106) affects the voltage on the D− pin 406 but not the voltage on the D+ pin 404. This change (or absence of change) in voltage on the D+ pin 404 is sensed using the comparator 416, rather than by using an ADC.

Figure 5:
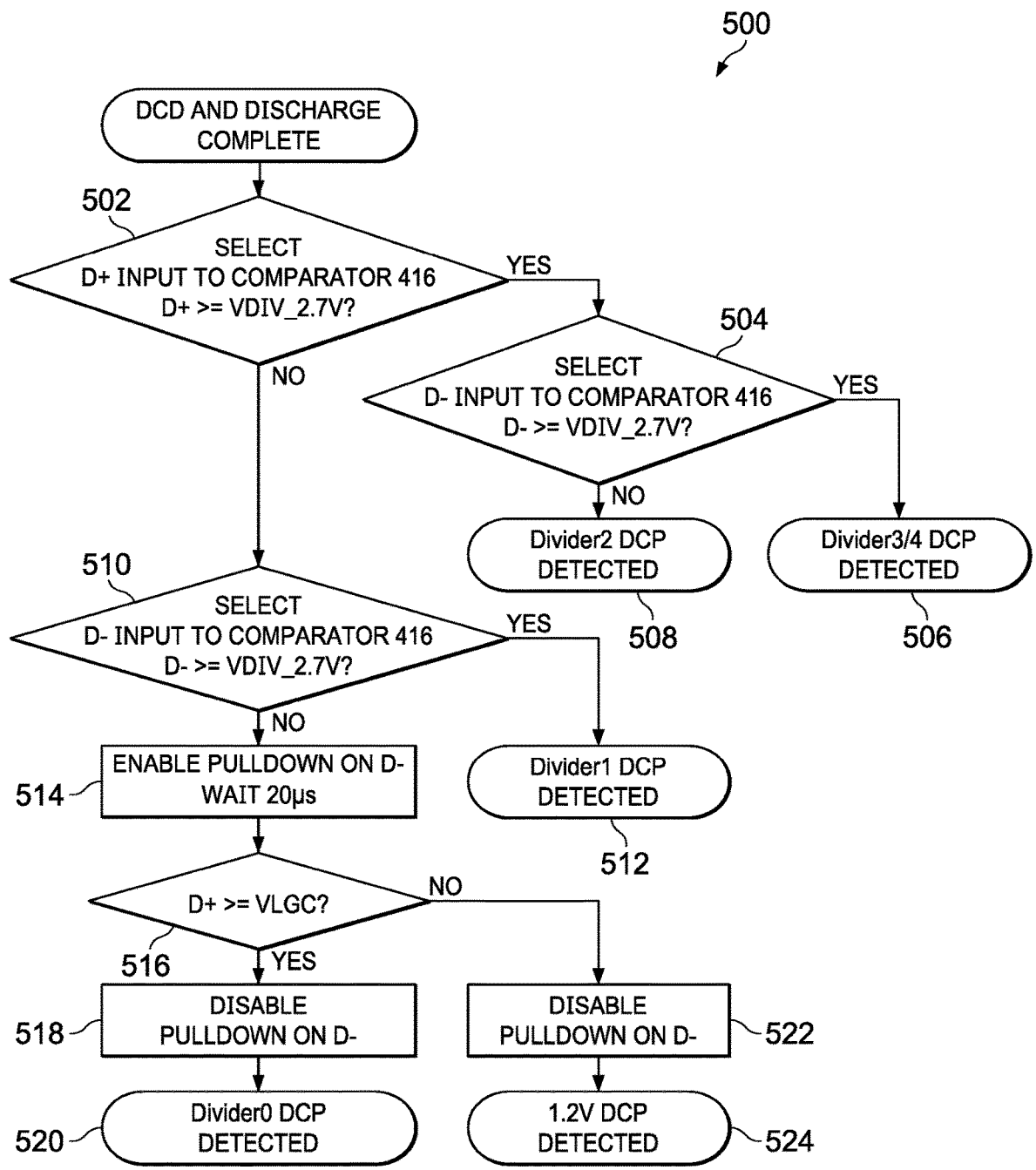
FIG. 5 is a flow diagram of a second method for making a charging port mode determination in the second PD in accordance with various examples.

FIG. 5 is a flow diagram of a second method 500 for making a charging port mode determination in the second PD 402 in accordance with various examples. The method 500 is described with reference to the components of the PD 402 shown in FIG. 4. The method 500 begins in response to the control circuit 414 receives the signal on the input 420 indicating that the PD 402 has completed DCD and allowed any voltages applied to the D+ and D− pins 404 and 406 during DCD to discharge.

In step 502 the control circuit 414 positions the switch 408 to couple the comparator 410 to the D+ pin 404. The control circuit 414 then senses the comparator output 412 to determine whether the D+ pin 404 is at or above VDIV_2.7V. If the D+ pin 404 is at or above VDIV_2.7V, in step 504 the control circuit 414 positions the switch 408 to couple the comparator 410 to the D− pin 406. The control circuit 414 then senses the comparator output 412 to determine whether the D− pin 406 is at or above VDIV_2.7V. If the D− pin 406 is at or above VDIV_2.7V, in step 506 the control circuit 414 provides a signal on the output 422 indicating that the PD 402 is connected to a DCP of Divider 3 or 4 mode and the method 500 ends. If the D− pin 406 is not at or above VDIV_2.7V, in step 508 the control circuit 414 provides a signal on the output 422 indicating that the PD 402 is connected to a DCP of Divider 2 mode and the method 500 ends.

If the D+ pin 404 is not at or above VDIV_2.7V in step 502, in step 510 the control circuit 414 positions the switch 408 to couple the comparator 410 to the D− pin 406. The control circuit 414 then senses the comparator output 412 to determine whether the D− pin 406 is at or above VDIV_2.7V. If the D− pin 406 is at or above VDIV_2.7V, in step 512 the control circuit 414 provides a signal on the output 422 indicating that the PD 402 is connected to a DCP of Divider 1 mode and the method 500 ends.

If it is determined in step 510 that the D− pin 406 is not at or above VDIV_2.7V, then in step 514 the control circuit 414 closes the switch 424 to couple the D− pin 406 to the pull down resistor 426. After a delay of at least 20 μs, in step 516 the control circuit 414 senses the comparator output 418 to determine whether the D+ pin 404 is at or above VLGC. If so, in step 518 the control circuit 414 opens the switch 424 to uncouple the D− pin 406 from the pull down resistor 426 and, in step 520, provides a signal on the output 422 indicating that the PD 402 is connected to a DCP of Divider 0 mode (e.g., DCP 106) and the method 500 ends.

If it is determined in step 516 that the D+ pin 404 is not at or above VLGC, then in step 522 the control circuit 414 opens the switch 424 to uncouple the D− pin 406 from the pull down resistor 426 and, in step 524, provides a signal on the output 422 indicating that the PD 402 is connected to a DCP of 1.2V short mode (e.g., DCP 202) and the method 500 ends.

Figure 6:
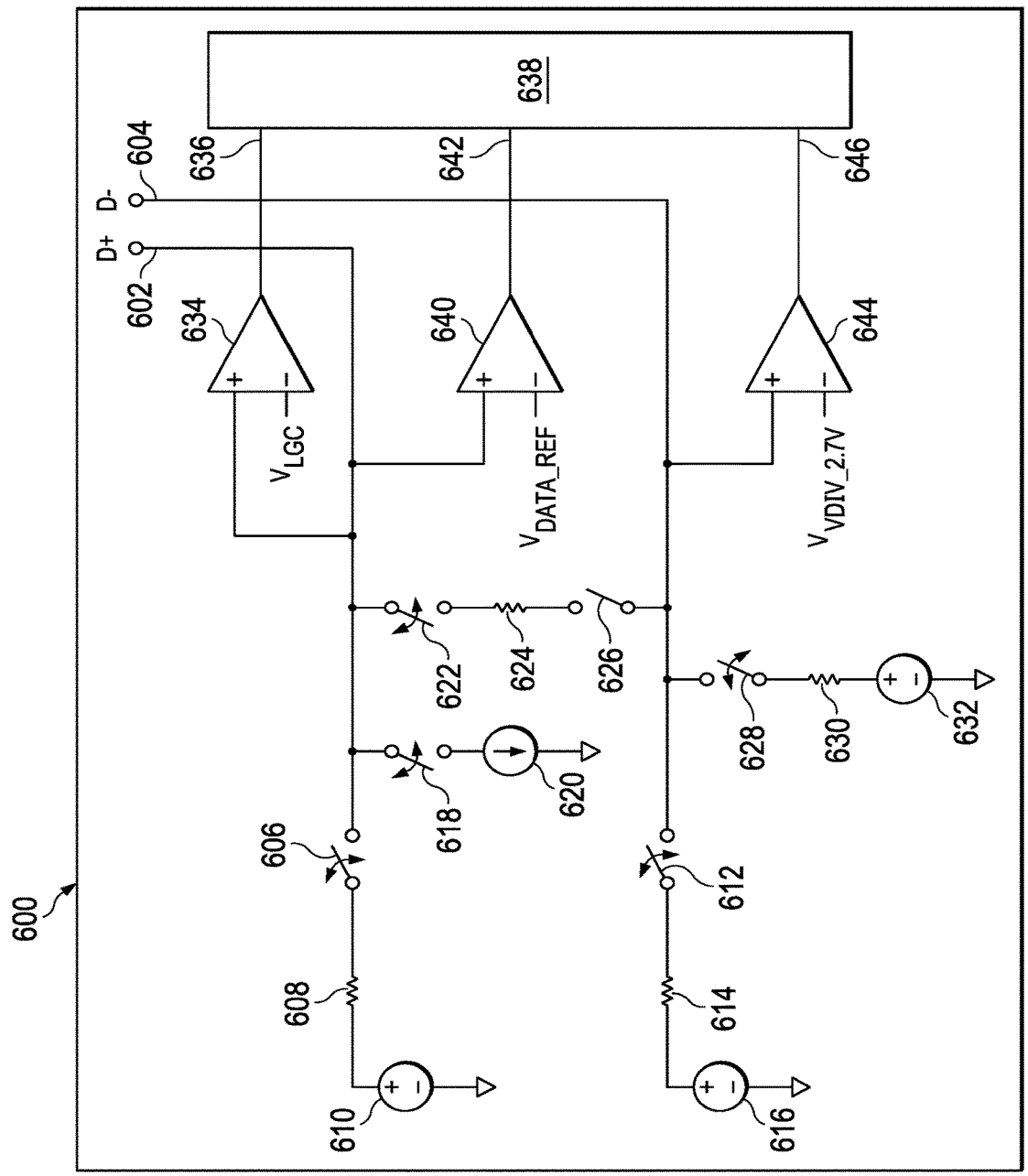
FIG. 6 is a schematic diagram of a battery charger in accordance with various examples.

FIG. 6 is a schematic diagram of a battery charger 600 in accordance with various examples. In accordance with various examples, the battery charger 600 may be any system or other device configured to charge an external device via a USB charging port. Examples of such systems include a tablet computer, laptop computer, and desktop computer. The battery charger 600 includes a D+ pin 602 and a D− pin 604. The D+ pin 602 and the D− pin 604 are coupled to one or more other components of the battery charger 600 that are not shown in FIG. 6.

The D+ pin 602 is coupled by a switch 606 through a resistor 608 having a nominal resistance of 30 kΩ, or otherwise in the range 24-36 kΩ, to a voltage source 610 providing a voltage of approximately 2.7V. The D− pin 604 is coupled by a switch 612 through a resistor 614 having the same resistance as the resistor 608 to a voltage source 616. In examples where the battery charger 600 advertises Divider 3 mode operation, the voltage source 616 provides a voltage of approximately 2.7V. In such examples, both the resistors 608 and 614 may couple to a single voltage source 616 providing a voltage of approximately 2.7V. In examples where the battery charger 600 advertises Divider 4 mode operation, the voltage source 616 provides a voltage of approximately 3.3V.

The D+ pin 602 is also coupled by a switch 618 to an IDP_SNK current sink, which is 620 configured to sink a current of 25-175 mA. The D+ pin 602 is further coupled by a switch 622 to a first terminal of a resistor 624 (RDCP) having a resistance less than 200Ω. A second terminal of the resistor 624 is coupled via a switch 626 to the D− pin 604. The D− pin 604 is also coupled by a switch 628 through a resistor 630 having a nominal resistance of 200Ω, or otherwise in the range 150-250Ω, to a voltage source 632 providing a voltage of approximately 1.28V.

The D+ pin 602 is also coupled to a non-inverting input of a comparator 634. An inverting input of the comparator 634 is coupled to a VLGC voltage source. An output 636 of the comparator 634 is coupled to a control circuit 638. The comparator 634 forms a circuit configured to provide a true value based on the D+ pin 602 being at or above VLGC and a false value otherwise.

The D+ pin 602 is further coupled to a non-inverting input of a comparator 640. An inverting input of the comparator 640 is coupled to a VDAT_REF voltage source providing a voltage of 0.25-0.4V. An output 642 of the comparator 640 is coupled to the control circuit 638. The comparator 640 forms a circuit configured to provide a true value based on the D+ pin 602 being at or above VDAT_REF and a false value otherwise.

The D− pin 604 is also coupled a non-inverting input of a comparator 644. An inverting input of the comparator 644 is coupled to a VDIV_2.7V voltage source. An output 646 of the comparator 644 is coupled to the control circuit 638. The comparator 644 forms a circuit configured to provide a true value based on the D− pin 604 being at or above VDIV_2.7V and a false value otherwise. As will be described with reference to FIG. 5, the control circuit 638 controls the switches 606, 612, 618, 622, 626, and 628 via control connections not shown in FIG. 6.

Figure 7:
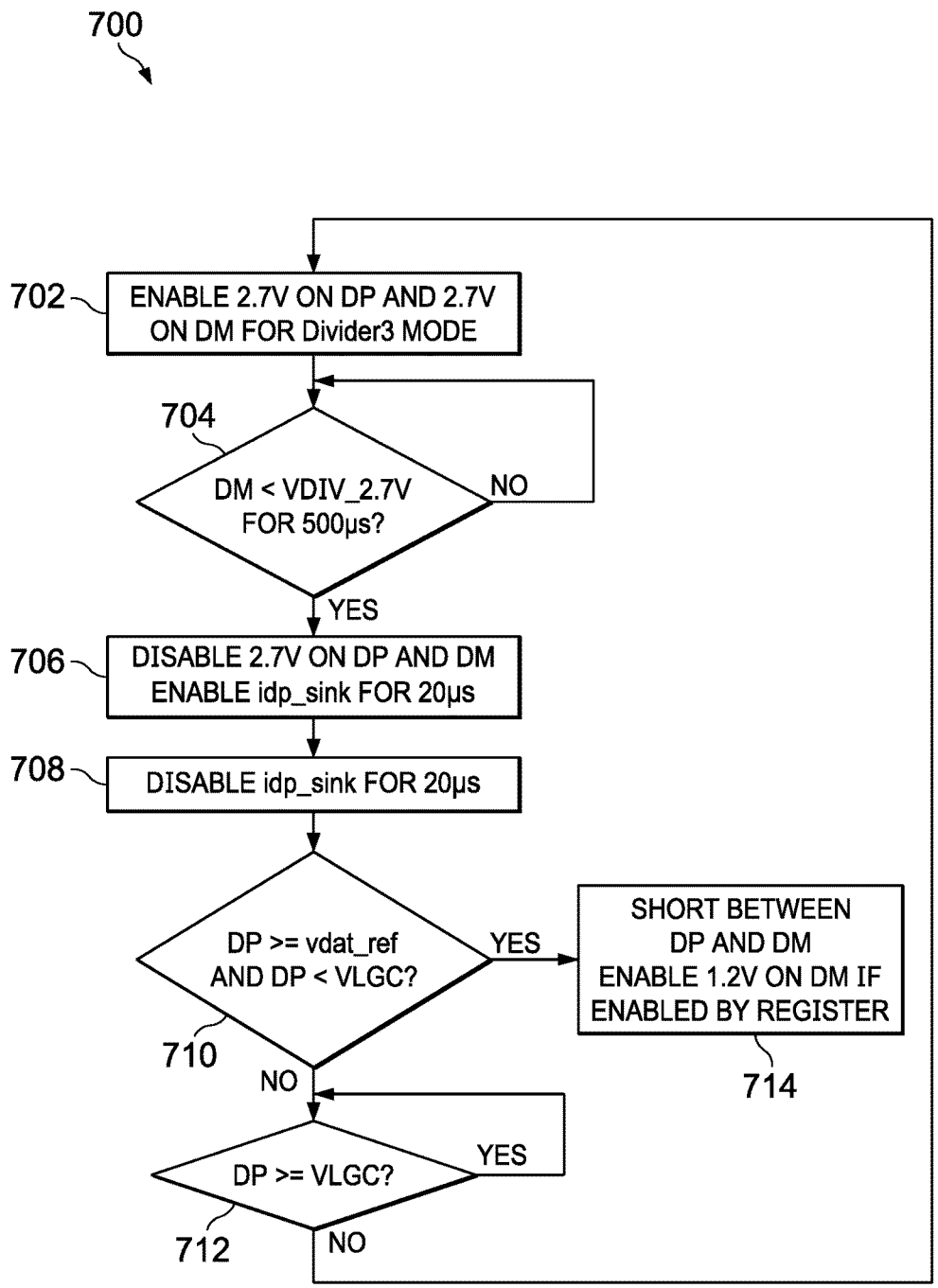
FIG. 7 is a flow diagram of a method for DCP Divider 3/4 mode advertisement after Data Contact Detect (DCD) in a battery charger in accordance with various examples.

FIG. 7 is a flow diagram of a method 700 for Divider Mode 3 (or, in some examples, Divider Mode 4) advertisement after DCD in a battery charger in accordance with various examples. The method 700 is described with reference to the components of the battery charger 600 shown in FIG. 6.

In step 702, the control circuit 638 closes the switches 606 and 612. This provides approximately 2.7V on both the D+ pin 602 and the D− pin 604, which advertises to a PD (not shown in FIG. 6) coupled to the D+ pin 602 and the D− pin 604 that the battery charger 600 is a Divider 3 mode charging port.

In response to being coupled to the D+ pin 602 and the D− pin 604 of the battery charger 600, the PD first performs an active or passive DCD process and then may perform Primary Detection. For DCD, a pulldown resistor having a nominal resistance of 15 kΩ is coupled to the D− pin 604 by the PD. For Primary Detection, a 25-175 uA current sink is coupled to the D− pin 604 by the PD. Both actions by the PD cause the D− pin 604 to drop from the approximate 2.7V level that the battery charger 600 is providing.

In step 704, the method repeatedly senses the output 646 of the comparator 644, to determine whether the D− pin 604 has dropped below VDIV_2.7V for a period longer than 500 μs. In response to this condition occurring, the method 700 continues with step 706 to determine whether the PD is performing DCD or Primary Detection. In step 706, the control circuit 638 opens the switches 606 and 612 to remove the voltages placed on the D+ pin 602 and the D− pin 604 in step 702. Also in step 706, the control circuit 638 closes the switch 618 to couple the IDP_SNK current sink 620 to the D+ pin 602. After 20 μs, in step 708 the control circuit 638 opens the switch 618 to uncouple the IDP_SNK current sink 620 from the D+ pin 602, having discharged at least some voltage remaining on the D+ pin 602.

For DCD, a 2.0-3.6V source configured to provide 7-13 μA is coupled to the D+ pin 602 by the PD, while for Primary Detection an approximately 600 millivolt (mV) source is coupled to the D+ pin 602 by the PD. To determine whether the PD is performing DCD or Primary Detection, in step 710, the control circuit 638 senses the output 642 of the comparator 640 and the output 636 of the comparator 634 to determine, respectively, whether the D+ pin 602 is both at or above VDAT_REF and below VLGC.

The condition tested for in step 710 will be determined to be false if the PD is performing DCD because the 2.0-3.6V provided to the D+ pin 602 by the PD during DCD will be above both VDAT_REF and VLGC. The method 700 will then go to step 712, where the control circuit 638 repeatedly senses the output 636 of the comparator 634 to determine whether the voltage on the D+ pin 602 has dropped below VLGC. This condition indicates that the PD has completed performing DCD and has removed the 2.0-3.6V source from the D+ pin 602. In response to the voltage on the D+ pin 602 dropping below VLGC, the method goes to step 702 to resume advertising that the battery charger 600 is a Divider 3 mode charging port.

The condition tested for in step 710 will be determined to be true if the PD is performing Primary Detection, because the 600 mV provided to the D+ pin 602 by the PD during Primary Detection will be above VDAT_REF but below VLGC. The method 700 then goes to step 714, where the control circuit 638 closes the switches 622 and 626 to advertise that the battery charger 600 is a short mode charging port. In some examples, based on the state of an enable flag or an input pin of the control circuit 638 (not shown in FIG. 6), the control circuit 638 may also close the switch 628 in step 714, to couple the 1.28V voltage source 632 to the D– pin 604, to advertise that the battery charger 600 is a 1.2V short mode charging port.

Figure 8:
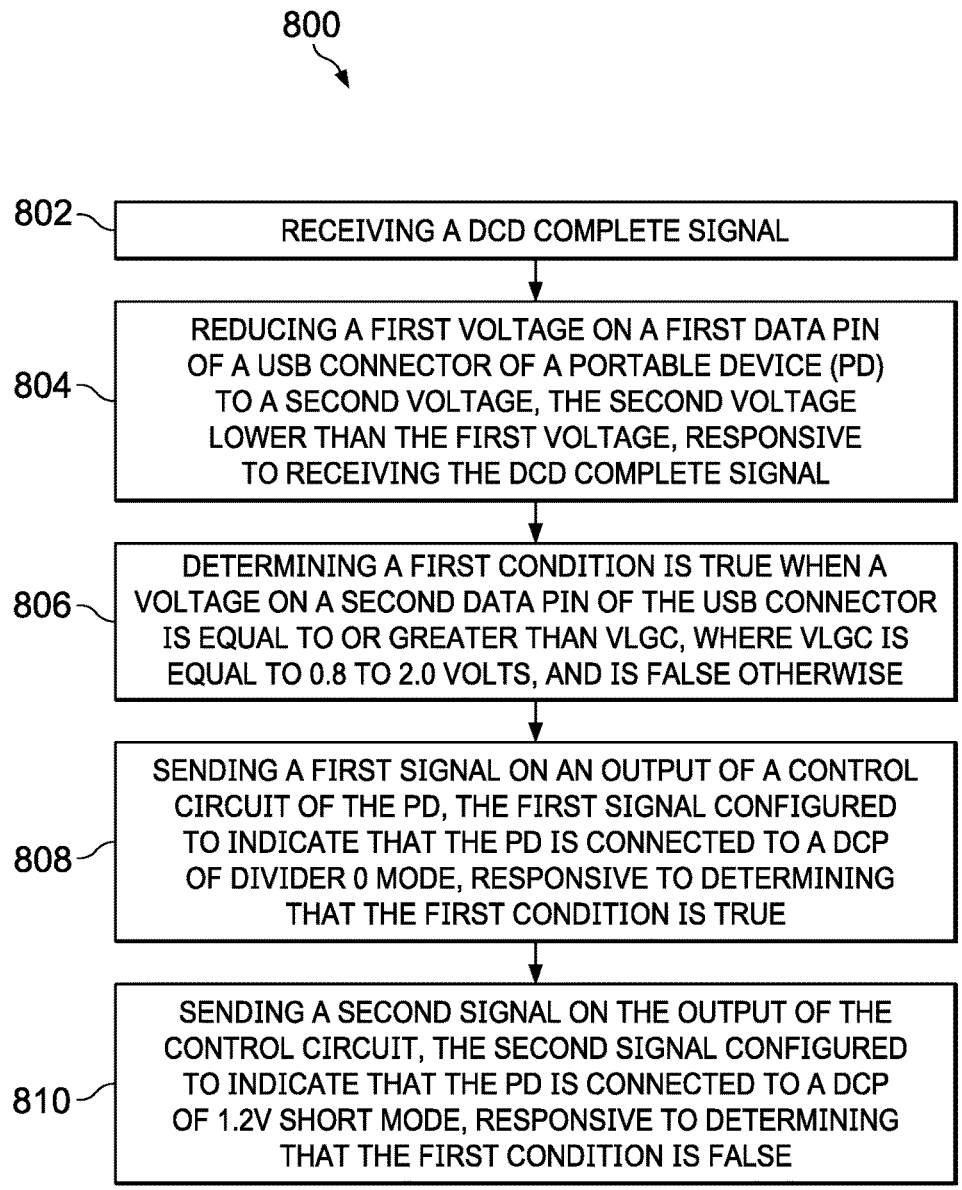
FIG. 8 is a flow diagram of a method for making a charging port mode determination in a PD in accordance with various examples.

FIG. 8 is a flow diagram of a method 800 for making a charging port mode determination in a PD in accordance with various examples. The method 800 includes steps of the method 500 described with reference to FIG. 5.

The method 800 begins at step 802, with the receipt of a DCD Complete signal. In step 804, a first voltage on a first data pin of a USB connector of the PD is reduced to a second voltage responsive to receiving the DCD Complete signal, where the second voltage is lower than the first voltage.

In step 806, a first condition is determined to be true if a voltage on a second data pin of the USB connector is equal to or greater than VLGC and to be false otherwise. In step 808, a first signal is sent on an output of the control circuit responsive to determining that the first condition is true, where the first signal configured to indicate that the PD is connected to a DCP of Divider 0 mode. In step 810, a second signal is sent on the output of the control circuit responsive to determining that the first condition is false, where the second signal configured to indicate that the PD is connected to a DCP of 1.2V short mode.

Figure 9:
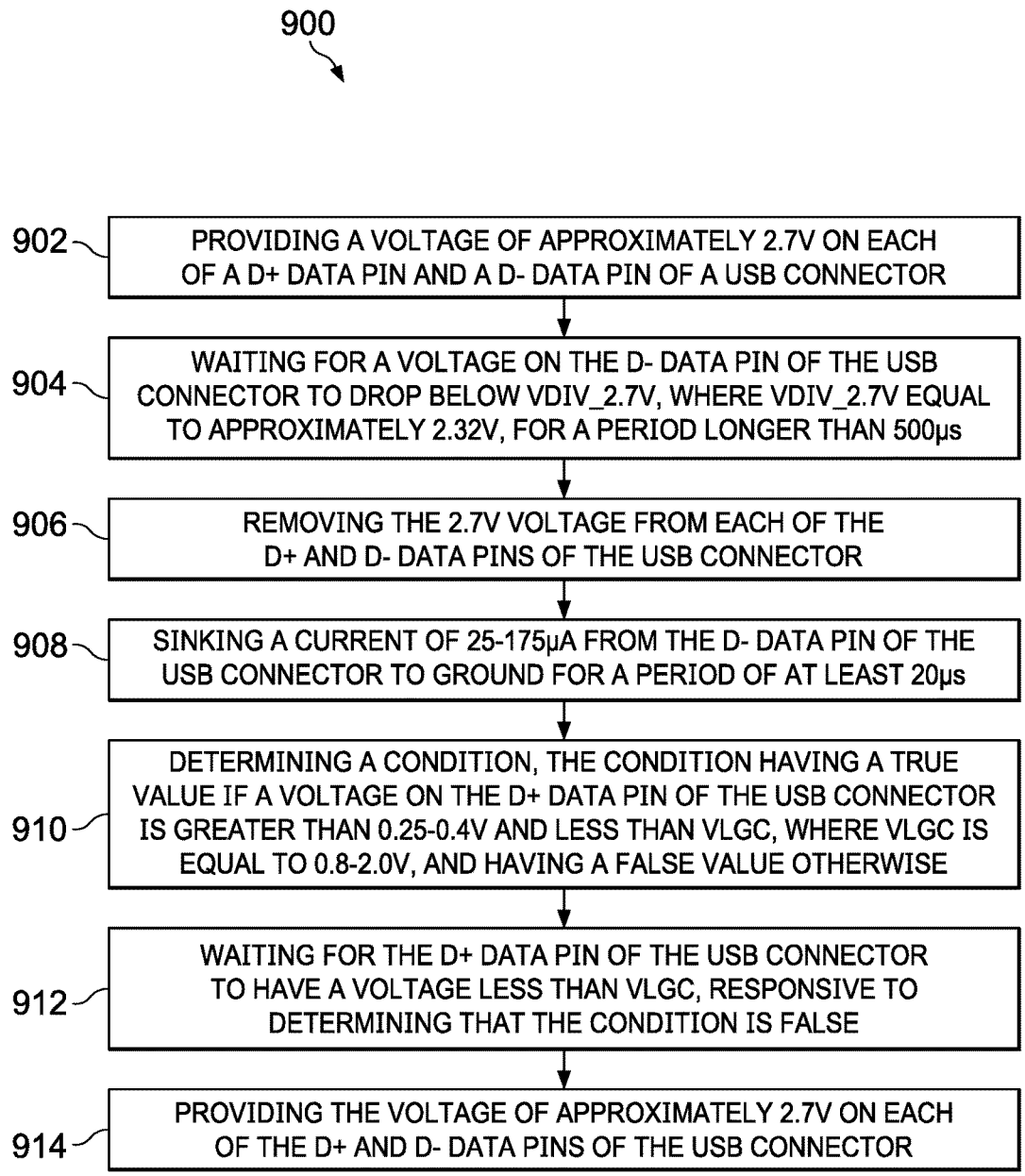
FIG. 9 is a flow diagram of a method for DCP Divider 3/4 mode advertisement after DCD in a battery charger in accordance with various examples.

FIG. 9 is a flow diagram of a method 900 for DCP Divider 3/4 mode advertisement after DCD in a battery charger in accordance with various examples. The method 900 includes steps of the method 700 described with reference to FIG. 7.

The method 900 begins at step 902, with providing a voltage of approximately 2.7V on each of a D+ data pin and a D– data pin of a USB connector of the battery charger. In step 904, the method 900 waits for a voltage on the D– data pin of the USB connector to drop below VDIV_2.7V for a period longer than 500 µs.

In step 906, the 2.7V voltage is removed from each of the D+ and D– data pins of the USB connector. In step 908, the method 900 sinks a current of 25-175 microamps (µA) from the D– data pin of the USB connector to ground for a period of at least 20 µs. In step 910, a condition is determined to have a true value if a voltage on the D+ data pin of the USB connector is greater than 0.25-0.4V and less than VLGC, and to have a false value otherwise. In step 912, responsive to determining that the condition is false, the method 900 waits for the D+ data pin of the USB connector to have a voltage less than VLGC. In step 914, the voltage of approximately 2.7V is provided on each of the D+ and D– data pins of the USB connector.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, in some examples by an end-user and/or a third-party.

Components shown as resistors, unless otherwise stated, are generally representative of any one or more elements coupled in series and/or parallel to provide an amount of impedance represented by the shown resistor. For example, a resistor shown and described herein as a single component may instead be multiple resistors coupled in parallel between the same nodes. For example, a resistor shown and described herein as a single component may instead be multiple resistors coupled in series between the same two nodes as the single resistor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A method, comprising:
    determining a charging port mode by:
        receiving a first signal;

reducing a voltage at a first terminal of a Universal Serial Bus (USB) connector of a portable device (PD) from a first voltage to a second voltage in response to receiving the first signal, wherein the second voltage is lower than the first voltage;

determining that a condition is true responsive to a third voltage at a second terminal of the USB connector being between a first threshold voltage and a second threshold voltage, and is false otherwise; and sending a second signal on a control circuit output of a control circuit of the PD in response to determining that the condition is true, or sending a third signal on the control circuit output in response to determining that the condition is false, wherein the second signal indicates that the PD is connected to a dedicated charging port (DCP) of Divider 0 mode, and the third signal indicates that the PD is connected to a DCP of 1.2V short mode.

2. The method of claim 1, wherein the first terminal is a D-data terminal, and the second terminal is a D+ data terminal.

3. The method of claim 1, wherein reducing the first voltage at the first terminal includes coupling the first terminal to ground through a resistor.

4. The method of claim 1, wherein determining the condition is true includes coupling a voltage comparator to the second terminal and sensing, by the control circuit, an output of the voltage comparator.

5. The method of claim 1, wherein the condition is a first condition and the determining a charging port mode is a first charging port mode, the method further comprising:

determining a second charging port mode responsive to the first signal, including by:

determining that a second condition is true responsive to a fourth voltage at the second terminal being equal to or greater than a third threshold voltage, and that the second condition is false otherwise;

determining that a third condition is true responsive to a fifth voltage at the first terminal being equal to or greater than the third threshold voltage, and that the third condition is false otherwise;

sending a fourth signal on the control circuit output in response to determining that the second and third conditions are true, wherein the fourth signal is configured to indicate that the PD is connected to a DCP of Divider 3/4 mode;

sending a fifth signal on the control circuit output in response to determining that the second condition is true and the third condition is false, wherein the fifth signal is configured to indicate that the PD is connected to a DCP of Divider 2 mode;

sending a sixth signal on the control circuit output in response to determining that the second condition is false and the third condition is true, wherein the sixth signal is configured to indicate that the PD is connected to a DCP of Divider 1 mode; and determining the first charging port mode responsive to determining that the second and third conditions are false.

6. A device, comprising:

a switch coupled between a first connector terminal and a ground terminal;

a circuit having a circuit input and a circuit output, wherein the circuit input is coupled to a second connector terminal, wherein the circuit is configured to provide a true value at the circuit output responsive to a voltage on the second connector terminal being between a first threshold voltage and a second threshold voltage, and provide a false value at the circuit output otherwise; and a control circuit having first and second control circuit inputs and first and second control circuit outputs, wherein the first control circuit input is coupled to the circuit output, the first control circuit output controls the switch, and the control circuit is configured to make a charging port mode determination by:

receiving a first signal at the second control circuit input;

closing the switch to couple the first connector terminal to the ground terminal in response to receiving the first signal;

determining whether a condition has a true value or a false value;

opening the switch;

sending a second signal to the second control circuit output to indicate that the device is coupled to a dedicated charging port (DCP) of Divider 0 mode in response to determining that the condition is true; and sending a third signal on the second control circuit output to indicate that the device is coupled to a DCP of Divider 1.2V short mode in response to determining that the condition is false.

7. The device of claim 6, wherein:

the first and second connector terminals are included on a Universal Serial Bus (USB) connector;

the first connector terminal is a USB D-data terminal; and the second connector terminal is a USB D+data terminal.

8. The device of claim 6, wherein:

the circuit includes a voltage comparator having first and second voltage comparator inputs and a voltage comparator output, wherein the first voltage comparator input is coupled to the second connector terminal, the second voltage comparator input is coupled to a voltage source, and the voltage comparator output is coupled to the first control circuit input.

9. The device of claim 6, wherein the switch is a first switch, the circuit is a first circuit, the condition is a first condition, and the charging port mode determination is a first charging port mode determination, the device further comprising:

a second switch having a second switch first terminal, a second switch second terminal and a second switch common terminal, wherein the second switch first terminal is coupled to the first connector terminal, and the second switch second terminal is coupled to the second connector terminal;

a second circuit having a second circuit input and a second circuit output, wherein the second circuit input is coupled to the second switch common terminal, and the second circuit is configured to provide a true value at the second circuit output responsive to a voltage on the second switch common terminal being equal to or greater than a third threshold voltage, and otherwise provide a false value at the second circuit output; and wherein the control circuit has a third control circuit input that is coupled to the second circuit output, the first control circuit output is configurable to actuate the second switch, and the control circuit is configurable to make a second charging port mode determination responsive to the first signal, by:

actuating the second switch to couple the second connector terminal to the second circuit input;

determining a value of a second condition, wherein the second condition has a true value if the second circuit output is a true value, and the second condition has a false value otherwise;

actuating the second switch to couple the first connector terminal to the second circuit input;

determining a value of a third condition, wherein the third condition has a true value if the second circuit output is a true value, and the third condition has a false value otherwise;

sending a fourth signal on the second control circuit output indicating that the device is connected to a DCP of Divider 3/4 mode in response to determining that the second and third conditions are true;

sending a fifth signal on the second control circuit output indicating that the device is connected to a DCP of Divider 2 mode in response to determining that the second condition is true and the third condition is false;

sending a sixth signal on the second control circuit output indicating that the device is connected to a DCP of Divider 1 mode in response to determining that the second condition is false and the third condition is true; and making the first charging port mode determination in response to determining that the second and third conditions are false.

10. The device of claim 9, wherein:

the first circuit includes a first voltage comparator having a first voltage comparator output, a first voltage comparator input, and a second voltage comparator input, wherein the first voltage comparator input is coupled to the second connector terminal, the second voltage comparator input is coupled to a first voltage source, and the first voltage comparator output is coupled to the first control circuit input; and the second circuit includes a second voltage comparator having a second voltage comparator output, a third voltage comparator input, and a fourth voltage comparator input, wherein the third voltage comparator input is coupled to the second switch common terminal, the fourth voltage comparator input is coupled to a second voltage source, and the second voltage comparator output is coupled to the third control circuit input.

11. A system, comprising:

a connector having first and second connector terminals;

a circuit having a circuit input and a circuit output, wherein the circuit input is coupled to the second connector terminal, wherein the circuit is configured to provide a true value at the circuit output responsive to a voltage on the second connector terminal being between a first voltage threshold and a second voltage threshold, and provide a false value at the circuit output otherwise; and a control circuit having first and second control circuit inputs and first and second control circuit outputs, wherein the control circuit is configurable to make a charging port mode determination by:

receiving a first signal on the second control circuit input;

coupling the first connector terminal to a ground terminal in response to receiving the first signal;

determining a value of a condition, wherein the condition has a true value if the circuit output is a true value, and the condition has a false value otherwise;

decoupling the first connector terminal from the ground terminal;

sending a second signal on the second control circuit output to indicate that the system is coupled to a dedicated charging port (DCP) of Divider 0 mode in response to determining that the condition is true; and sending a third signal on the second control circuit output to indicate that the system is coupled to a DCP of Divider 1.2V short mode in response to determining that the condition is false.

12. The system of claim 11, wherein:

the connector is a Universal Serial Bus (USB) connector;
the first connector terminal is a USB D-data terminal; and
the second connector terminal is a USB D+data terminal.

13. The system of claim 11, wherein:

the circuit includes a voltage comparator having first and second voltage comparator inputs and a voltage comparator output, wherein the first voltage comparator input is coupled to the second connector terminal, the second voltage comparator input is coupled to a voltage source, and the voltage comparator output is coupled to the first control circuit input.

* * * * *